(12) United States Patent
Isogai et al.

(10) Patent No.: US 7,915,926 B2
(45) Date of Patent: Mar. 29, 2011

(54) SEMICONDUCTOR CHIP AND SEMICONDUCTOR DEVICE INCLUDING THE SAME

(75) Inventors: Hideo Isogai, Kawasaki (JP); Kentarou Tanaka, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/772,748

(22) Filed: May 3, 2010

(65) Prior Publication Data
US 2010/0283508 A1  Nov. 11, 2010

(30) Foreign Application Priority Data
May 11, 2009  (JP) .................. 2009-114600

(51) Int. Cl.
*H01L 25/00* (2006.01)
*H03K 19/00* (2006.01)
(52) U.S. Cl. ............................. 326/101; 326/56; 326/82
(58) Field of Classification Search .................. None
See application file for complete search history.

(56) References Cited

U.S. PATENT DOCUMENTS

| 7,492,036 | B2 | 2/2009 | Nakatsu et al. | |
|---|---|---|---|---|
| 7,688,109 | B2 * | 3/2010 | Monden et al. | 326/56 |
| 2003/0211679 | A1 * | 11/2003 | Kim et al. | 438/200 |

FOREIGN PATENT DOCUMENTS

JP  2006-245063 A  9/2006

* cited by examiner

*Primary Examiner* — Anh Q Tran
(74) *Attorney, Agent, or Firm* — Sughrue Mion, PLLC

(57) ABSTRACT

A semiconductor chip includes a plurality of pads, input circuits or output circuits that are electrically connected to the pads, a main control unit that outputs a read access signal, the read access signal controlling reading of signals from an external circuit or an internal circuit, and activation control units that control activation of the input circuits or the output circuits that are electrically connected to the pads based on the read access signal, the pads receiving the signals from the external circuit or the internal circuit.

7 Claims, 7 Drawing Sheets

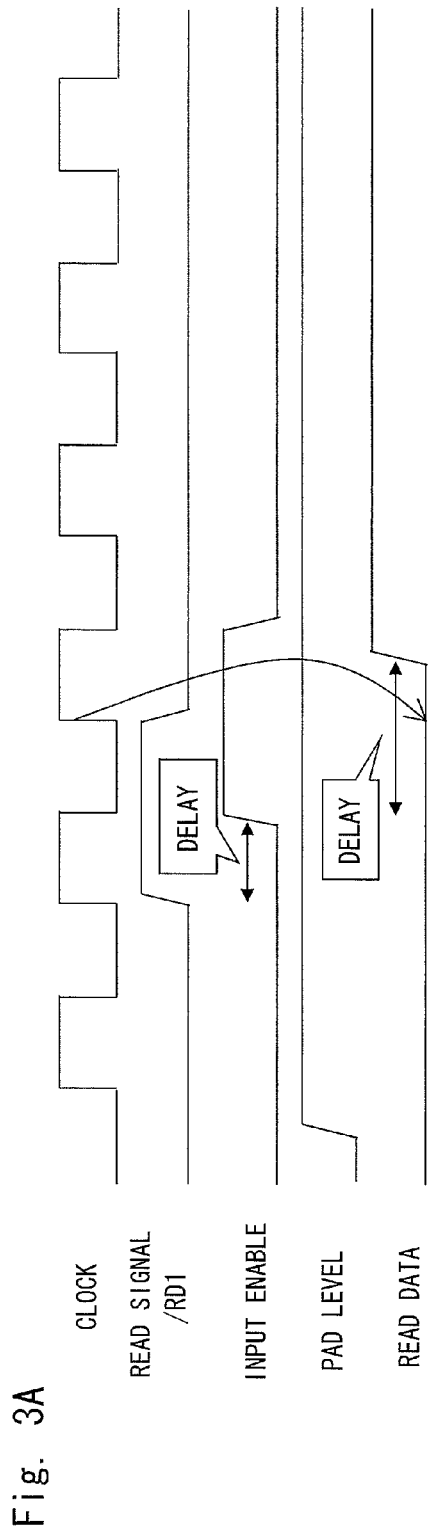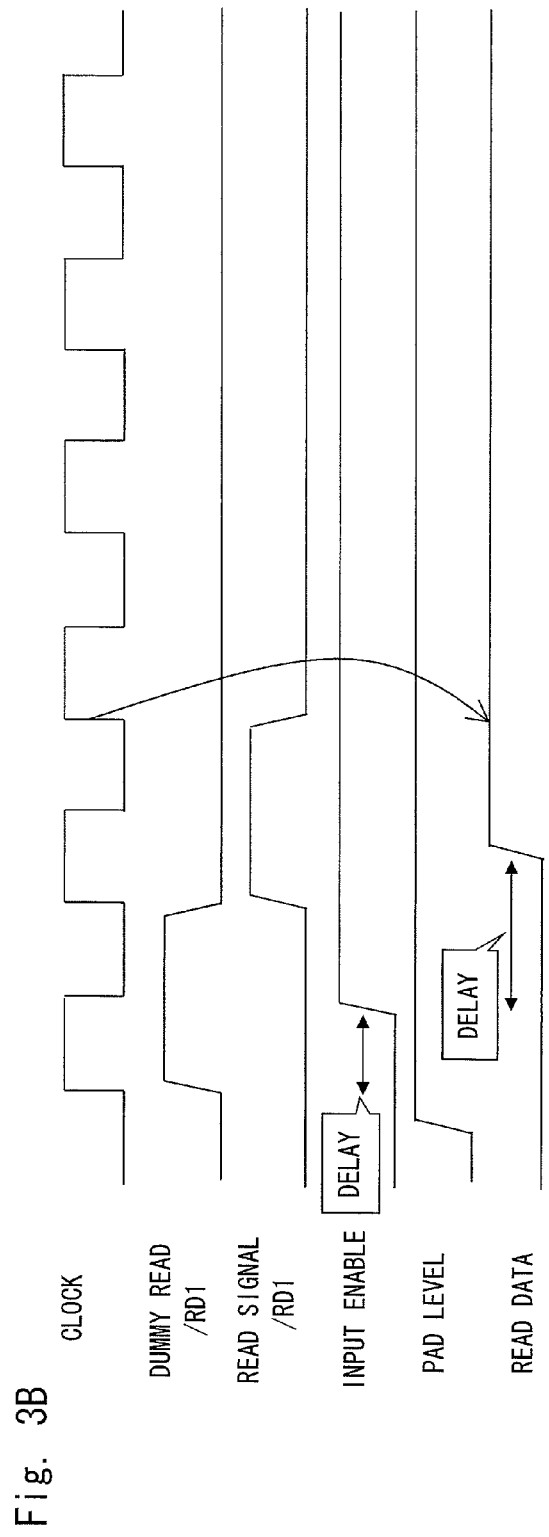

US 7,915,926 B2

SEMICONDUCTOR CHIP AND SEMICONDUCTOR DEVICE INCLUDING THE SAME

INCORPORATION BY REFERENCE

This application is based upon and claims the benefit of priority from Japanese patent application No. 2009-114600, filed on May 11, 2009, the disclosure of which is incorporated herein in its entirety by reference.

BACKGROUND

1. Field of the Invention

The present invention relates to a semiconductor chip and a semiconductor device including the same.

2. Description of Related Art

A method shown in FIG. 7 is generally known, for example, as a method of controlling data input and data output between a package on which a semiconductor chip including an input terminal is mounted and an external substrate device connected outside the package. FIG. 7 is a diagram describing a problem solved by the present invention. Hereinafter, a semiconductor chip according to a related art will be described with reference to FIG. 7.

As shown in FIG. 7, a semiconductor chip 300 that is mounted on a package is connected to an external substrate device which is provided outside the package. The semiconductor chip 300 includes a pad 301, a CPU (Central Processing Unit) 302, an input buffer 303, and an internal circuit 304. The pad 301 is connected to a pad 305 of the package by bonding. The pad 305 is further connected to a pad 306 of the external substrate device.

The CPU 302 supplies a read access signal /RD to the input buffer 303. The read access signal /RD becomes active when the CPU 302 executes read command, and validates the signal input to the pad 301.

The input buffer 303 transfers the input signal from the pad 301 to the internal circuit 304 based on the read access signal /RD. The input buffer 303 outputs a high-level or low-level signal in response to the input signal. In summary, upon receiving the read access signal /RD from the CPU 302, the input buffer 303 transfers the external signal applied to the pad 301 to the internal circuit 304.

SUMMARY

However, in the semiconductor chip 300 shown in FIG. 7, the input buffer 303 that is once activated can be constantly activated only when the read access signal /RD is made active. In short, the input buffer 303 that is activated to receive the input signal cannot be constantly activated for a desired period of time.

As a technique that is related to the present invention, Japanese Unexamined Patent Application Publication No. 2006-245063 discloses a technique of controlling whether to activate an input circuit based on product information stored in chips to use chips having the same main function but mounted on different packages in common. Japanese Unexamined Patent Application Publication No. 2006-245063 sets only the buffer of the pad connected to the package to active based on the product information and sets the pad that is electrically floated without being connected to the package (so-called free pad) to inactive, so as to prevent malfunction caused by the through current that flows in the free pad.

A first exemplary aspect of the present invention is a semiconductor chip including a plurality of pads, input circuits or output circuits that are electrically connected to the pads, a main control unit that outputs a read access signal, the read access signal controlling reading of signals from an external circuit or an internal circuit, and activation control units that control activation of the input circuits or the output circuits that are electrically connected to the pads based on the read access signal, the pads receiving the signals from the external circuit or the internal circuit.

By providing the activation control units that control activation of the input circuits or the output circuits, the input circuits that are activated can be constantly activated for a desired period of time.

A second exemplary aspect of the present invention is a semiconductor device including a semiconductor chip including a plurality of pads, input circuits or output circuits that are electrically connected to the pads, a main control unit that outputs a read access signal, the read access signal controlling reading of signals from an external circuit or an internal circuit, and activation control units that control activation of the input circuits or the output circuits that are electrically connected to the pads based on the read access signal, the pads receiving the signals from the external circuit or the internal circuit, and leads on which the semiconductor chip is mounted, the leads electrically connected to the pads.

By providing the activation control units that control activation of the input circuits or the output circuits, the input circuits that are activated can be constantly activated for a desired period of time.

A third exemplary aspect of the present invention is a semiconductor chip including a plurality of pads, input circuits or output circuits that are electrically connected to the pads, a main control unit that outputs a read access signal, the read access signal controlling reading of signals from an external circuit or an internal circuit, and activation control units that control activation of the input circuits or the output circuits that are electrically connected to the pads based on the read access signal, the pads receiving the signals from the external circuit or the internal circuit, in which each of the activation control units includes a logical OR circuit that outputs logical OR between the read access signal output from the main control unit and an activation signal output from the flip-flop, and a flip-flop that latches an output signal from the logical OR circuit, and outputs the activation signal that activates the input circuit or the output circuit, the activation control units set the input circuits or the output circuits that are electrically connected to the pads to an active state in advance based on a first read access signal, the pads receiving the signals from the external circuit or the internal circuit, and the input circuits or the output circuits which are made active transfer signals applied to the pads from the external circuit to the internal circuit or transfer signals applied to the pads from the internal circuit to the external circuit based on a second read access signal that is output subsequent to the output of the first read access signal.

By providing the activation control units that control activation of the input circuits or the output circuits, the input circuits that are activated can be constantly activated for a desired period of time.

According to the semiconductor chip and the semiconductor device that mounts the semiconductor chip of the present invention, it is possible to provide the semiconductor chip and the semiconductor device that mounts the semiconductor chip that make it possible to constantly activate the input circuits that are activated for a desired period of time.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 3A is a timing chart describing an example of the operation of a semiconductor device according to a related art;

FIG. 3B is a timing chart describing an example of the operation of the semiconductor device according to the first exemplary embodiment;

DETAILED DESCRIPTION OF THE EXEMPLARY EMBODIMENTS

Hereinafter, the specific exemplary embodiments of the present invention will be described in detail with reference to the drawings. For the sake of clarity, the following description and the drawings are partially omitted or simplified as appropriate. Throughout the drawings, the same components having the same structures or functions are denoted by the same reference symbols, and description thereof will be omitted.

First Exemplary Embodiment

Figure 1:
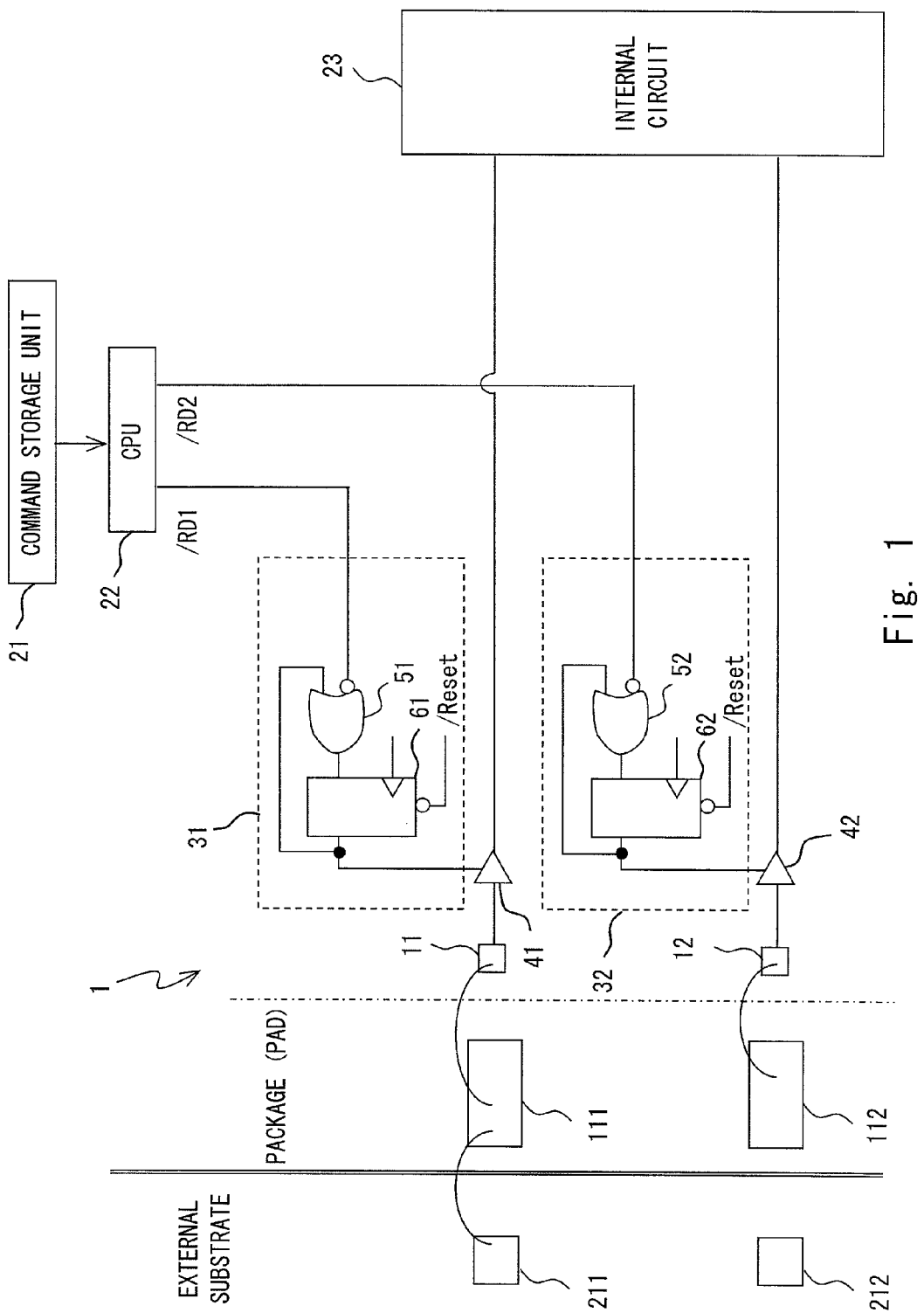
FIG. 1 is a block diagram showing a semiconductor device according to a first exemplary embodiment.

Referring to FIGS. 1 to 3A and 3B, a semiconductor device according to a first exemplary embodiment of the present invention will be described. FIG. 1 is a block diagram showing the semiconductor device according to the first exemplary embodiment of the present invention. In FIG. 1, a package that mounts a semiconductor chip 1 can be connected to an external substrate device provided outside thereof. The right side in the drawing shows the semiconductor chip 1, the center shows a lead (external pin) to which the semiconductor chip 1 is connected, and the left side shows a lead (external pin) to which the package of the semiconductor device is connected. An SSOP (Shrink Small Outline Package) or a QFP (Quad Flat Package) may be employed as the package, for example.

As shown in FIG. 1, the semiconductor integrated circuit according to the first exemplary embodiment includes pads 11 and 12, a command storage unit 21, a CPU 22 as a main control unit, an internal circuit 23, activation control units 31 and 32, and buffers 41 and 42 as input circuits.

The buffer 41 transfers an input signal from the pad 11 to the internal circuit 23 based on an activation signal output from the activation control unit 31. The pad 11 is connected to a pad 111 of the package by bonding. The pad 111 is further connected to a pad 211 of the external substrate device.

The buffer 42 transfers an input signal from the pad 12 to the internal circuit 23 based on an activation signal output from the activation control unit 32. The pad 12 is connected to a pad 112 of the package by bonding. In this example, it is assumed that the pad 112 is not connected to a pad 212 of the external substrate device.

The CPU 22 outputs read access signals based on predefined commands stored in the command storage unit 21. The CPU 22 outputs a read access signal /RD1 to the activation control unit 31. The CPU 22 outputs a read access signal /RD2 to the activation control unit 32.

In the command storage unit 21, programs to execute the predefined command is stored by a user that uses the external substrate device. The predefined command includes a read access command to activate buffers 41 and 42 to read out data from the external circuit of the external substrate device by the internal circuit 23 when there is a need to activate the buffers 41 and 42 to receive input signals. The command storage unit 21 is formed by a non-volatile memory such as a flash memory.

Thus, operation states (active state, inactive state) of the buffers 41 and 42 are controlled by receiving necessary signals. Setting the buffers 41 and 42 to active means that the buffers 41 and 42 output high-level or low-level signals in response to the input signals. Setting the buffers 41 and 42 to inactive means that output parts of the buffers 41 and 42 are in high impedance state, which means that both of a drive transistor and a pull-up transistor are OFF.

Upon receiving the read access signal /RD1 from the CPU 22, the activation control unit 31 controls transfer of the external signal applied to the pad 11 to the internal circuit 23. The activation control unit 31 includes a logical OR circuit 51 that outputs the logical OR of the activation signal and the read access signal /RD1, and a flip-flop 61 that latches the output signal of the logical OR circuit 51 and outputs the activation signal. The flip-flop 61 latches the signal output from the logical OR circuit 51 until when the reset signal /Reset is input. The activation control unit 31 outputs the activation signal to control the buffer 41. The buffer 41 validates or invalidates the signal input from the pad 11.

The activation control unit 31 outputs the signal that activates the buffer 41 when the read access signal /RD1 becomes active. Upon receiving this signal, the buffer 41 transfers the signal input from the pad 11 to the internal circuit 23. Thus, when the activation signal is active, the signal input from the external pin 111 is transferred to the pad 11 that is connected by a bonding wire, and is transferred to the internal circuit 23 from the pad 11 through the buffer 41. In short, the signal input to the pad 11 through the external pin 111 from the pad 211 of the external substrate device is transferred to the internal circuit 23.

When the active state is reset by a reset signal /Reset, the activation control unit 31 outputs a signal that inactivates the buffer 41. The buffer 41 that receives this signal does not transfer the signal input from the pad 11 to the internal circuit 23. Accordingly, the signal input from the external pin 111 is not transferred to the internal circuit 23 from the pad 11 through the buffer 41 when the activation signal is inactive.

Receiving the read access signal /RD2 from the CPU 22, the activation control unit 32 controls transfer of the external signal applied to the pad 12 to the internal circuit 23. The activation control unit 32 includes a logical OR circuit 52 that outputs the logical OR of the activation signal and the read access signal /RD2, and a flip-flop 62 that latches the output signal of the logical OR circuit 52 and outputs the activation signal. The activation control unit 32 outputs the activation signal to control the buffer 42. The buffer 42 validates or invalidates the signal that is input from the pad 12.

The activation control unit 32 outputs the signal that activates the buffer 42 when the read access signal /RD2 is active. Thus, when the activation signal is active, the signal input from the external pin 112 is transferred to the pad 12 that is connected by a bonding wire, and is transferred to the internal circuit 23 from the pad 12 through the buffer 42. The activation control unit 32 outputs a signal that inactivates the buffer 42 when the active state is reset by the reset signal /Reset. Thus, when the activation signal is inactive, the signal input from the external pin 112 is not transferred to the internal circuit 23 from the pad 12 through the buffer 42. In this example, the external pin 112 is not connected to the pad 212 of the external substrate device, and thus, the CPU 22 outputs the inactive read access signal /RD2, as will be described.

Figure 2A:
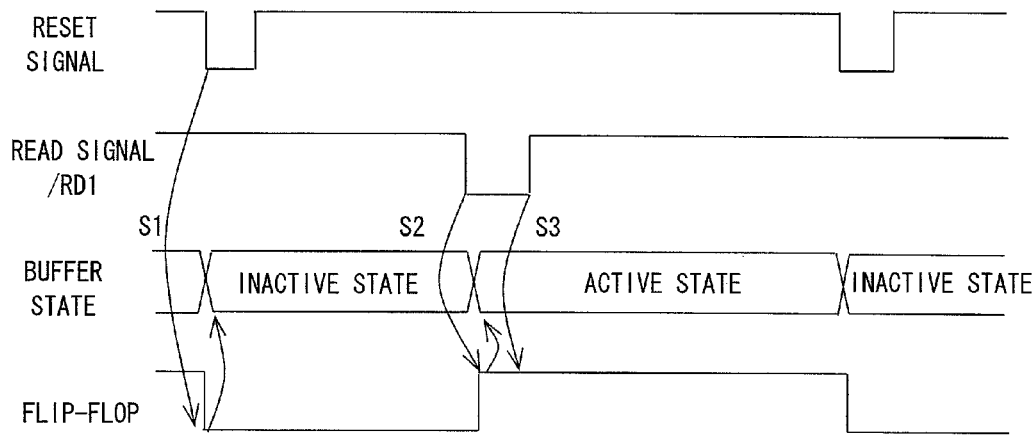
FIG. 2A is a timing chart describing an example of the operation of the semiconductor device according to the first exemplary embodiment.
Figure 2B:
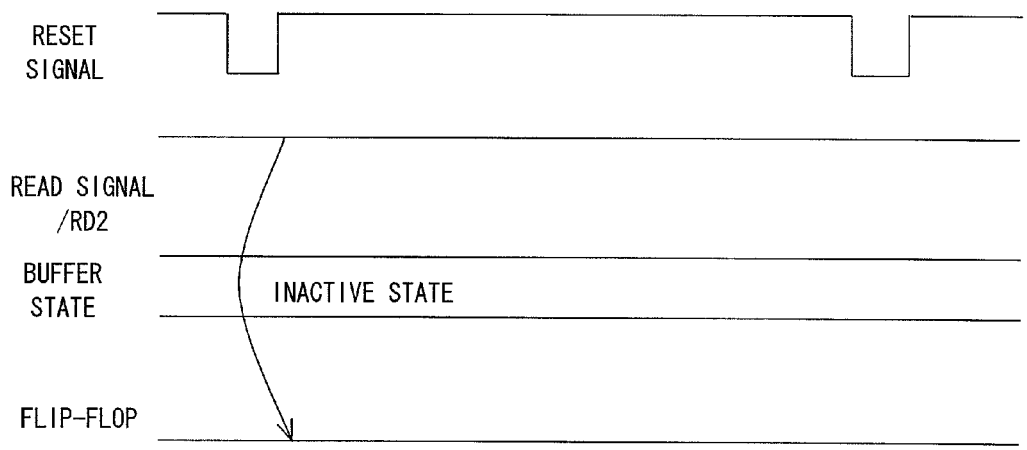
FIG. 2B is a timing chart describing an example of the operation of the semiconductor device according to the first exemplary embodiment.

Referring now to FIGS. 2A and 2B, the operation of the semiconductor device according to the first exemplary embodiment of the present invention will be described. FIGS. 2A are 2B each shows a timing chart showing the example of the operation of the semiconductor device according to the first exemplary embodiment of the present invention. FIG. 2A shows the activation control by the activation control unit 31 shown in FIG. 1, and FIG. 2B shows the activation control by the activation control unit 32 shown in FIG. 1.

In FIG. 2A, first, the value of the flip-flop 61 is cleared by the reset signal /Reset, so that the buffer 41 is inactivated (S1). Then, when the read access signal /RD1 from the CPU 22 is active, the logical OR of the output signal of the flip-flop 61 and the read access /RD1 signal is written into the flip-flop 61, and the buffer 41 is concurrently activated (S2). Even when the read access signal /RD1 is inactive, the value of the flip-flop 61 is not changed until when the reset signal /Reset is input, and thus the buffer 41 can keep the active state (S3). In FIG. 2B, as the pad 112 is not connected to the pad 212 of the external substrate device, the read access signal /RD2 from the CPU 22 is set to inactive, and the buffer 42 is not activated.

After the activation signals are stored in the flip-flops 61 and 62, the stored values of the flip-flops 61 and 62 are constantly stored in the flip-flops 61 and 62. Thus, after the activation of the buffers 41 and 42 is performed once, the active state is kept for a desired period of time until when the reset operation is performed. Thus, as long as the transfer of the input signal to the internal circuit 23 is required, only the buffer 41 or 42 connected to the pad connected to the external substrate device can be activated.

Referring next to FIGS. 3A and 3B, high speed operation will be described. FIG. 3A is a diagram describing the activation control by a semiconductor device according to a related art of the present invention shown in FIG. 7. FIG. 3B is a diagram describing the activation control by the semiconductor device according to the first exemplary embodiment of the present invention.

In FIG. 3A, first, the voltage of the external signal applied to the pad 301 from the external substrate device is changed, which means that the pad level is changed. Then, the CPU 302 that responds to the read access command sets the read access signal /RD active. After the read access signal /RD becomes active, the input by the buffer 303 becomes enable with some delay (which means that the buffer 303 is controlled to be active with some delay after the read access signal /RD is raised). Further, the CPU 302 reads out the pad level of the pad 301 as read data with some delay after the input is enabled (which means that the read data starts to be transferred to the internal circuit 304 by reading out the signal of the pad level as the read data by the buffer 303 that is in the active state when the read access signal /RD is fallen).

Figure 7:
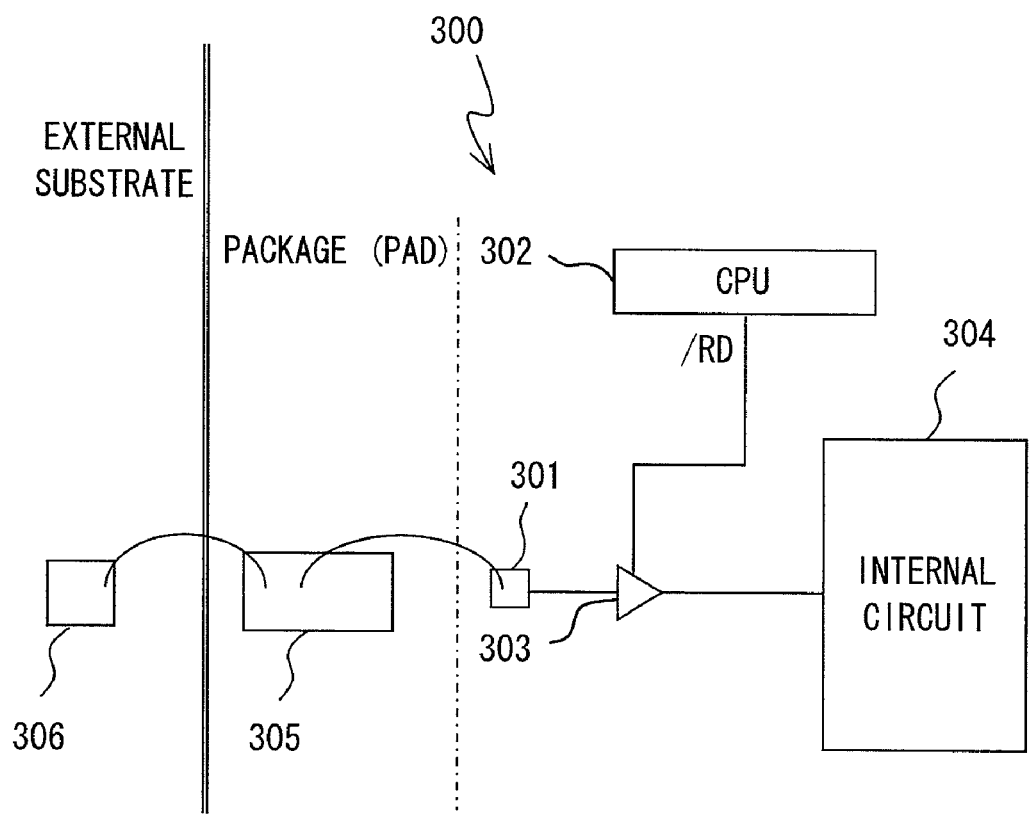
FIG. 7 is a diagram describing a problem solved by the present invention.

As shown in FIG. 3A, in the semiconductor chip 300 shown in FIG. 7, when the input buffer 303 that is suspended is activated in the high-speed operation, the timing at which the input buffer 303 is activated is delayed, and false data may be read out. More specifically, the CPU 302 reads out the read data of low when the read access signal /RD is fallen, which means the data that is different from the pad level of the pad 301 is read out. Even though it is desired that the data after the pad level becomes high is read out, the data before the pad level becomes high (data section when the pad level is low, which is the state before the pad level is switched) is actually read out as the data read out by the CPU 302.

On the other hand, as shown in FIG. 3B, in the semiconductor chip 1 according to the first exemplary embodiment of the present invention, the input by the buffer 41 is set enable in advance by a dummy read signal /RD1 prior to the activation of the read access signal /RD1. More specifically, first, the voltage of the external signal applied from the external substrate device to the pad 11 is changed. Then, after the CPU 22 activates the dummy read access signal /RD1, the input by the buffer 41 becomes enable with some delay, and thereafter, the buffer 41 is kept active (which means that the buffer 41 is controlled to be active when the dummy read access signal /RD1 is raised, and thereafter the active state is kept). Further, after the input is enabled, the pad level of the pad 11 read out by the CPU 22 becomes high with some delay. Then, after the CPU 22 sets the read access signal /RD1 active, the CPU 22 reads out the pad level of the pad 11 as read data (which means that the pad level starts to be read out when the read access signal /RD1 is fallen). In the command storage unit 21, the execution timing of the dummy read signal for the read access signal is predetermined and stored for the read access command that is stored.

As stated above, in the semiconductor chip 1 according to the first exemplary embodiment of the present invention, the CPU 22 activates the buffer 41 by the dummy read signal /RD1 prior to the read access signal /RD1 that actually instructs the timing of starting reading of read data, and keeps its state, so as to be able to read out read data that is equal to the pad level of the pad 11. In summary, as the data that is read out is already high despite the delay at a timing at which the read data is started to be read out based on the read access signal /RD1, whereby it is possible to prevent low data from being wrongly read out. Hence, even in the high-speed operation, it is possible to read out accurate data according to the timing of read access.

Second Exemplary Embodiment

Figure 4:
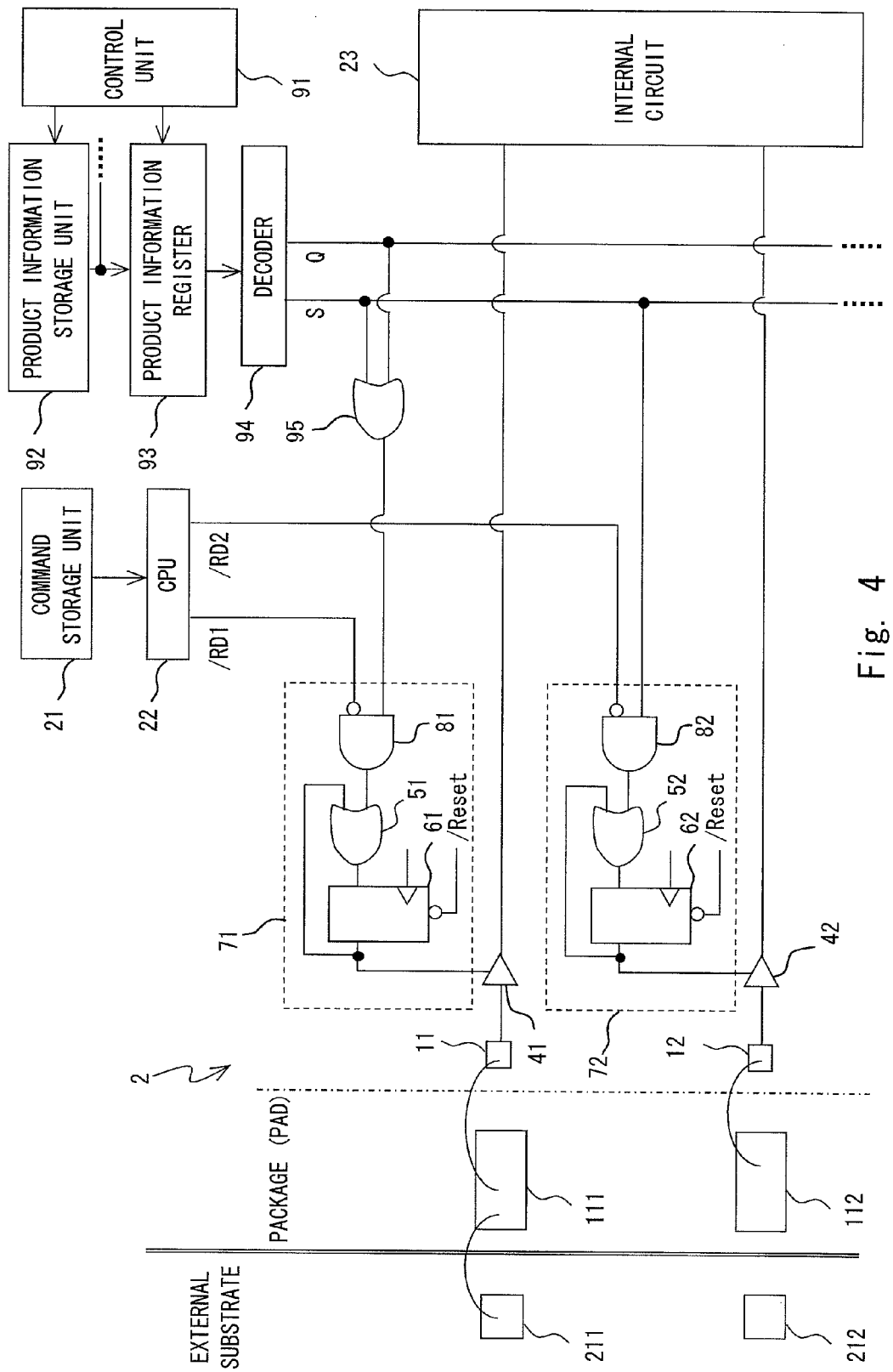
FIG. 4 is a block diagram showing a semiconductor device according to a second exemplary embodiment.
Figure 5A:
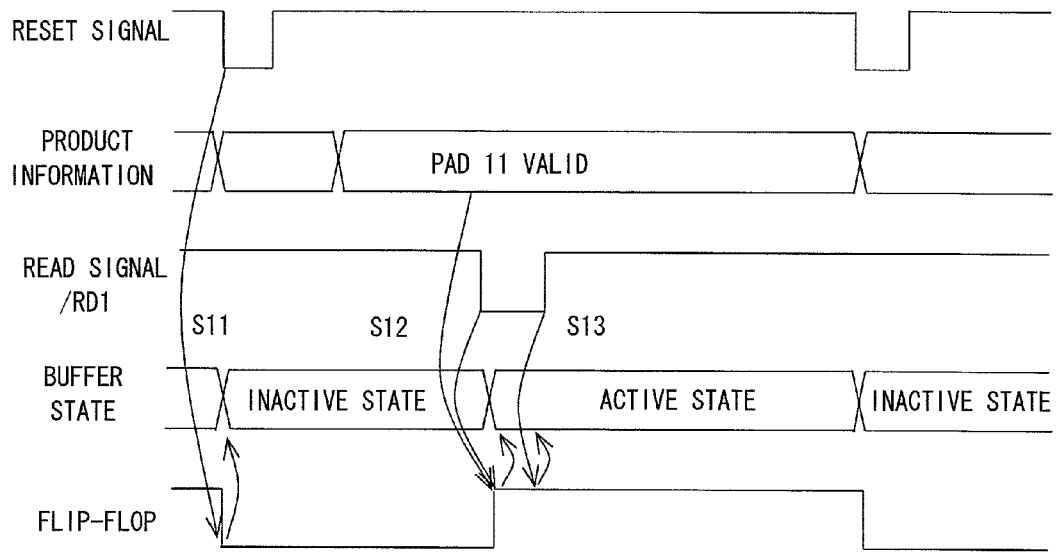
FIG. 5A is a timing chart describing an example of the operation of the semiconductor device according to the second exemplary embodiment.
Figure 5B:
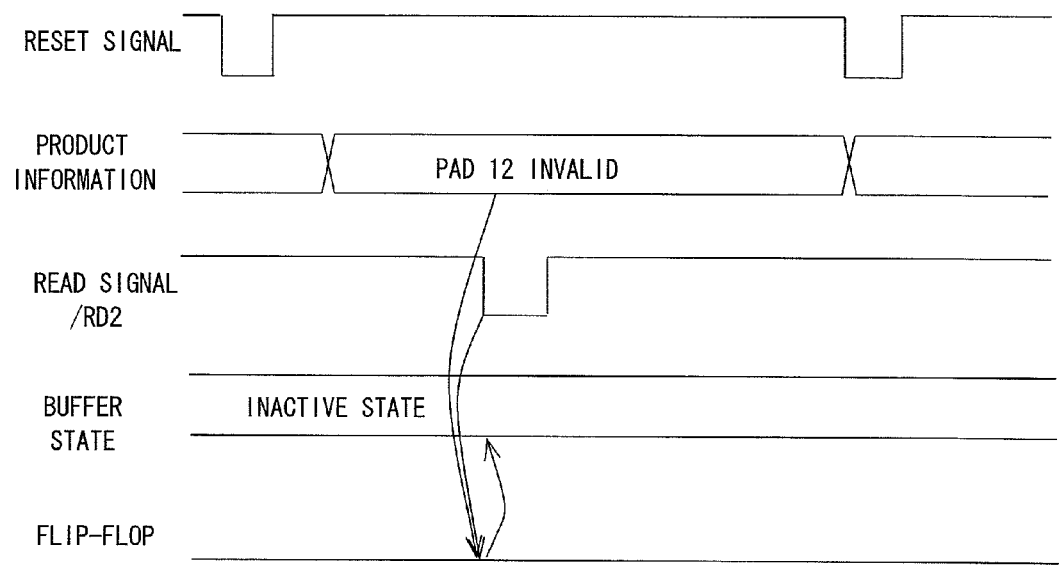
FIG. 5B is a timing chart describing an example of the operation of the semiconductor device according to the second exemplary embodiment.

Referring now to FIGS. 4, 5A and 5B, a semiconductor device according to the second exemplary embodiment of the present invention will be described. In the semiconductor device according to the first exemplary embodiment described above, the buffers 41 and 42 are controlled only based on the read access signals. On the other hand, in the semiconductor device according to the second exemplary embodiment, the buffers 41 and 42 are further controlled based on product information. In the following description, the difference between the first exemplary embodiment and the second exemplary embodiment will be mainly described, and the same structures and processing to those of the first exemplary embodiment will not be explained.

FIG. 4 is a block diagram showing the semiconductor device according to the second exemplary embodiment of the present invention. As shown in FIG. 4, a semiconductor integrated circuit according to the second exemplary embodiment includes the pads 11 and 12, the command storage unit 21, the CPU 22, the internal circuit 23, activation control units 71 and 72, the buffers 41 and 42, a control unit 91, a product information storage unit 92, a product information register 93, a decoder 94, and a logical OR circuit 95.

The control unit 91 is activated immediately after the power is supplied to the semiconductor chip 2, and controls an initial setting operation based on the product information. This initial setting is carried out prior to the start of an operation instructed by a user. Alternatively, the control unit 91 may be activated immediately after a reset operation is carried out while the power is supplied to the semiconductor chip 2.

The product information storage unit 92 stores the information with regard to the product in which this semiconductor chip 2 is installed (a shape of the package, the number of pins, memory capacity, a range of an operation function and the like). The product information storage unit 92 includes a flash memory such as a non-volatile memory, and the product information is stored therein prior to the installation of the semiconductor chip on the package. The product information storage unit 92 is controlled by the control unit 91, and outputs the product information that is stored therein to the product information register 93. The product information that is held therein is decoded by the decoder 94, and signals S and Q are output. The signal S is supplied to the activation control units 71, 72. The signal Q is supplied to the activation control unit 71.

The product information stored in the product information storage unit 92 is supplied to the respective sections of the semiconductor chip 2, in accordance with the control of the control unit 91. A part of the product information concerning with the number of external pins (leads) is held in the product information register 93. The holding timing is controlled by the control unit 91. The product information is held in the product information register 93 until the power source is turned off. Thus, the product information that is output from the product information register 93 is not changed until the power source is turned off.

The decoder 94 decodes the product information output from the product information register 93, and outputs a control signal corresponding to the number of external pins. In this example, the decoder 94 outputs the two kinds of signals Q and S, in accordance with the package on which the semiconductor chip 2 is installed and the number of external pins thereof. The signal Q becomes active when the installation package is the QFP package, to validate the signal input to the pad. The signal S becomes active when the installation package is the SSOP package, to validate the signal input to the pad.

The product information includes pin number information and memory size information. A code is assigned according to the number of external pins, and the pin number information is indicated based on the code. For example, the code "000" is assigned in case of 32 pins, and the code "001" is assigned in case of 40 pins. When this code is decoded, a signal corresponding to the number of pins provided for the product can be generated. That is, the decoder 94 decodes this code, and outputs the signal S when the code is "000", and outputs the signal Q when the code is "001". Thus, in the semiconductor chip installed on the SSOP package, the code "000" is set as the product information in the product information storage unit 92 after being installed on the package. In the semiconductor chip installed on the QFP package, the code "001" is set as the product information in the product information storage unit 92.

The activation control unit 71 transfers the input signal from the pad 11 to the internal circuit 23 based on the signal S, the signal Q, and the read access signal /RD1. The pad 11 is connected to the lead (external pin) 111 of the package on which the semiconductor chip 2 is installed by bonding. For example, when the semiconductor chip 2 is installed on the SSOP package, the semiconductor chip 2 is connected to the lead (external pin) of the SSOP by bonding. When the semiconductor chip 2 is installed on the QFP package, the semiconductor chip 2 is connected to the lead (external pin) of the QFP package by bonding.

The activation control unit 71 includes a logical OR circuit 51 that outputs the logical OR of the activation signal and the output signal of a logical AND circuit 81, a flip-flop 61 that latches the output signal of the logical OR circuit 51 and outputs the activation signal, and a logical AND circuit 81 that outputs the logical AND of the output signal from the logical OR circuit 95 and the read access signal /RD1. In this example, the control signals S and Q, and the read access signal /RD are received by combination of the logical AND circuit 81 and the logical OR circuit 51. However, other logics may be employed according to the active level of the activation signal, the read access signal /RD, and the control signals S, Q.

The activation control unit 71 outputs the signal that activates the buffer 41 when the read access signal /RD1 and the output signal of the logical OR circuit 95 are active. Upon receiving this signal, the buffer 41 transfers the signal that is input to the pad 11 from the pad 211 of the external substrate device through the external pin 111 to the internal circuit 23.

When any of the signals S and Q is active, the logical OR circuit 95 outputs the active signal to the logical AND circuit 81. Thus, when the read access signal /RD1 is active and the package on which the semiconductor chip 2 is installed is SSOP package, the signal input from the external pin 111 is transferred to the pad 11 that is connected by the bonding wire, and is transferred to the internal circuit 23 from the pad 11 through the buffer 41. Further, when the read access signal /RD1 is active and the package on which the semiconductor chip 2 is installed is QFP package, the signal input from the external pin 111 is transferred to the pad 11 connected by the bonding wire, and is transferred to the internal circuit 23 from the pad 11 through the buffer 41.

The activation control unit 72 transfers the input signal from the pad 12 to the internal circuit 23 based on the signal S and the read access signal /RD2. The pad 12 is connected to the lead 112 of the QFP package by bonding when the semiconductor chip 2 is installed on the QFP package, for example. However, the pad 12 is not connected to an external device when the semiconductor chip 2 is installed on the SSOP package.

The activation control unit 72 includes a logical OR circuit 52 that outputs the logical OR of the activation signal and the output signal of a logical AND circuit 82, a flip-flop 62 that latches the output signal of the logical OR circuit 52 and outputs the activation signal, and a logical AND circuit 82 that outputs the logical AND of the control signal Q and the read access signal /RD2.

The activation control unit 72 outputs the signal that activates the buffer 42 when the read access signal /RD2 and the control signal S are active. Upon receiving this signal, the buffer 42 transfers the signal that is input to the pad 12 from the pad 212 of the external substrate device through the external pin 112 to the internal circuit 23. Note that, in this example, the external pin 112 is not connected to the pad 212 of the external substrate device, and the CPU 22 outputs inactive read access signal /RD2.

Accordingly, when the read access signal /RD2 is active and the package on which the semiconductor chip 2 is installed is the SSOP package, the signal input from the external pin 112 is transferred to the pad 12 that is connected by the bonding wire, and is transferred to the internal circuit 23 from the pad 12 through the buffer 42. Further, even when the read access signal /RD2 is active, the signal that is input from the external pin 111 is not transferred to the internal circuit 23 through the buffer 42 if the package on which the semiconductor chip 2 is installed is not the QFP package. Further, even when the package on which the semiconductor chip 2 is installed is the QFP package, the signal input from the external pin 112 is not transferred to the internal circuit 23 through the buffer 42 if the read access signal /RD2 is inactive.

Referring next to FIGS. 5A and 5B, the operation of the semiconductor device according to the second exemplary embodiment of the present invention will be described. FIGS. 5A and 5B are timing charts showing examples of the operation of the semiconductor device according to the second exemplary embodiment of the present invention. FIG. 5A is a diagram describing activation control by the activation control unit 71 shown in FIG. 4, and FIG. 5B is a diagram describing activation control by the activation control unit 72 shown in FIG. 4.

In FIG. 5A, first, the value of the flip-flop 61 is cleared by the reset signal /Reset, so that the buffer 41 is inactivated (S11). When the read access signal /RD1 from the CPU 22 becomes active and the output signal of the logical OR circuit 95 based on the product information becomes active, the logical OR of the output signal of the logical AND circuit 81 and the output signal of the flip-flop 61 is written into the flip-flop 61, and at the same time, the buffer 41 is activated (S12). Even when the read access signal /RD1 becomes inactive, the value of the flip-flop 61 does not vary until when the reset signal /Reset is output, and thus the buffer 41 is kept to active state (S13). In FIG. 5B, the control signal S based on the product information is inactive, and the buffer 42 is not activated.

In Japanese Unexamined Patent Application Publication No. 2006-245063, the buffer cannot be controlled to be inactive state for the pads that are connected in the package but floated without being connected on the external substrate device used by the user. In Japanese Unexamined Patent Application Publication No. 2006-245063, activation of the buffer is controlled only based on the product information. Thus, it is impossible to judge whether to connect the terminal that is connected in the package and validated on the external substrate device, for example. Hence, in Japanese Unexamined Patent Application Publication No. 2006-245063, malfunction may be caused by activating the buffer for the pads that are floated without being connected on the external substrate device. Meanwhile, in the semiconductor device according to the second exemplary embodiment, the buffers 41 and 42 are controlled based on the product information and the read access signals /RD1 and /RD2 from the CPU 22, so that it is possible to control the buffer so that it is activated only when the user actually uses it (which means when the pad is actually connected on the external substrate device).

Third Exemplary Embodiment

Figure 6:
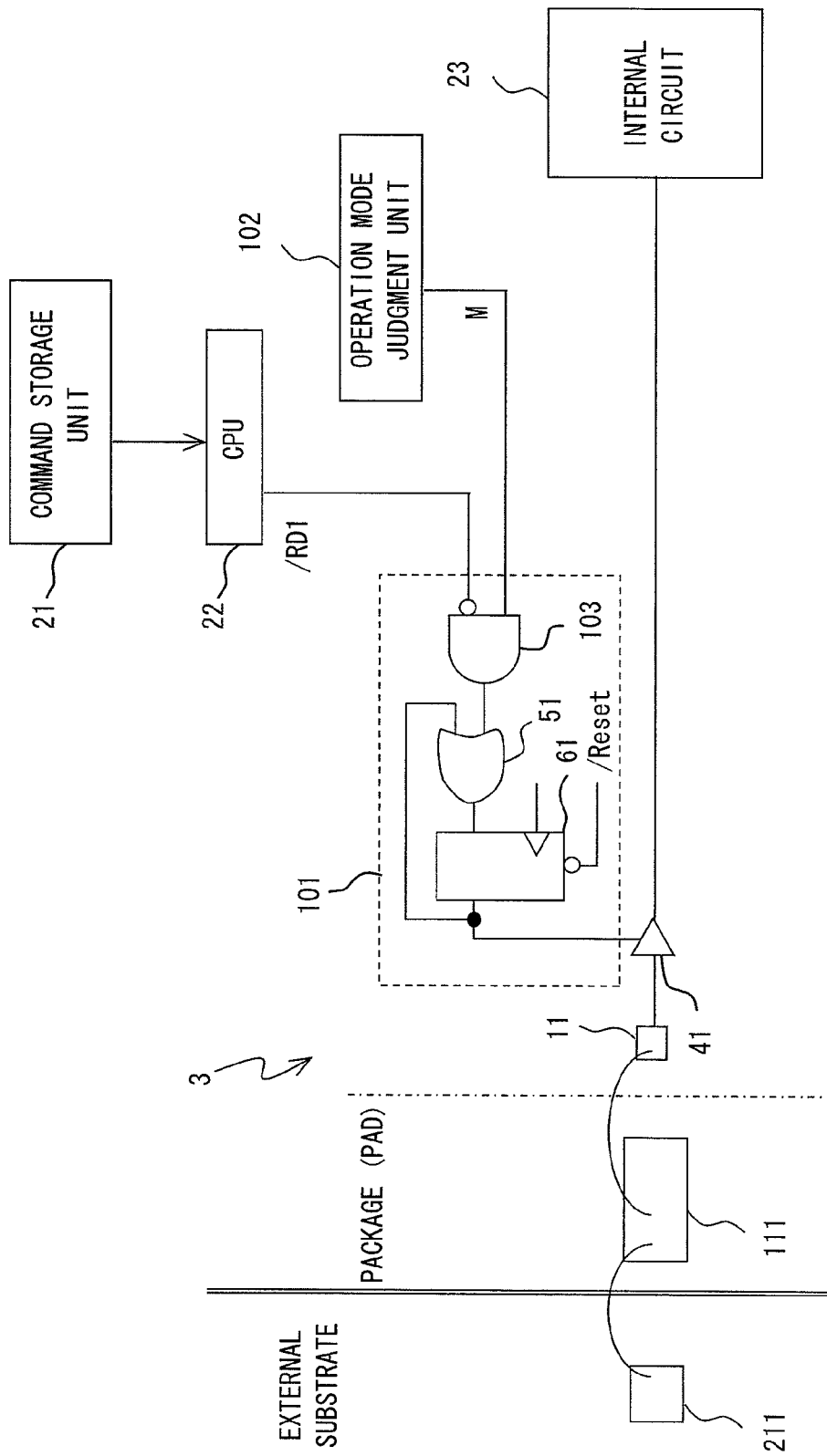
FIG. 6 is a block diagram showing a semiconductor device according to a third exemplary embodiment.

Referring next to FIG. 6, a semiconductor device according to the third exemplary embodiment of the present invention will be described. While description has been made in the first exemplary embodiment that the buffers 41 and 42 are controlled only based on the read access signals /RD1 and /RD2, the buffer 41 is controlled further based on the operation mode in the semiconductor device according to the third exemplary embodiment. In the following description, the difference between the first exemplary embodiment and the third exemplary embodiment will be mainly described, and the same structures and processing as those of the first exemplary embodiment will not be described.

FIG. 6 is a block diagram showing the semiconductor device according to the third exemplary embodiment of the present invention. As shown in FIG. 6, the semiconductor integrated circuit according to the third exemplary embodiment includes the pad 11, the command storage unit 21, the CPU 22, the internal circuit 23, an activation control unit 101, the buffer 41, and an operation mode judgment unit 102.

The operation mode judgment unit 102 judges the operation mode setting in using the pad 11 (digital input mode/digital output mode/analog input mode/analog output mode/LCD output mode and the like) and outputs an operation mode judgment signal M. When the operation mode setting is the digital input mode, the operation mode judgment unit 102 outputs the active operation mode judgment signal M. When the operation mode setting is other than the digital input mode, the operation mode judgment unit 102 outputs the inactive operation mode judgment signal M.

Receiving the operation mode judgment signal M from the operation mode judgment unit 102 and the read access signal /RD1 from the CPU 22, the activation control unit 101 controls transfer of the external signal that is applied to the pad 11 to the internal circuit 23. The activation control unit 101 includes a logical OR circuit 51 that outputs the logical OR of the activation signal and the output signal of a logical AND circuit 103, a flip-flop 61 that latches the output signal of the logical OR circuit 51 and outputs the activation signal, and a logical AND circuit 103 that outputs the logical AND of the operation mode judgment signal M and the read access signal /RD1.

The activation control unit 101 outputs the signal that activates the buffer 41 when the read access signal /RD1 and the operation mode judgment signal M are both active. Upon receiving this signal, the buffer 41 transmits the signal that is input from the pad 211 of the external substrate device to the pad 11 through the external pin 111 to the internal circuit 23.

In this way, by judging activation of the buffer 41 according to the operation mode setting in using the pad 11 in addition to the read access signal /RD1, it is possible to prevent the buffer 41 from being activated in response to the false read access signal /RD1 from the CPU 22. For example, when the buffer 41 is the buffer that functions both as an input buffer and an output buffer and the operation mode setting is in the output mode, the operation mode judgment signal M is set to inactive, whereby it is possible to prevent the data from being wrongly read out from the external substrate device by the internal circuit 23. Further, when the buffer 41 is the input buffer that functions both in a digital mode and an analog mode, for example, the operation mode judgment signal M is made active only when the mode is the digital input mode, whereby it is possible to prevent the false data from being read out from the external substrate device.

Other Exemplary Embodiments

While description has been made in the above second exemplary embodiment that the buffers 41 and 42 are controlled based on the read access signal and the product information, the second exemplary embodiment may be combined with the third exemplary embodiment. In summary, the buffers 41 and 42 may be controlled based on the read access signal, the product information, and the operation mode. In this case, the buffers 41 and 42 are activated only when all the signals of the read access signal, the control signals S and Q based on the product information, and the operation mode judgment signal M are active.

Further, in each of the above-described exemplary embodiments, the internal circuit 23 reads out data from the external substrate device in response to the read access command from the CPU 22. However, the present invention is not limited to this example. By constantly activating the buffer also in other cases than activating the buffer according to the timing of the read access command, for example when asynchronous serial communication or interruption input is carried out, the input signal can be received at a desired timing that is different from the timing that the read access command is output.

Although the buffer is used as the input circuit in each of the above exemplary embodiments, the present invention is not limited to this example but the buffer may be used as the output circuit.

As described in each of the exemplary embodiments, the following effect can be attained according to the semiconductor device of the present invention.

First, by providing the activation control unit that controls activation of the buffer, the buffer that is activated can be constantly activated for a desired period of time. The activation control unit according to the present invention can be realized with a small-sized additional circuit.

Further, by controlling only the buffer connected to the pad used by being connected to the external substrate device to be active or inactive, it is possible to easily prevent the buffer connected to the pad that is floated without being connected to the external substrate device from being activated.

Also in the high-speed operation, the CPU activates the buffer by the dummy read signal in advance to keep the state prior to the read access signal to instruct the timing of actually starting reading of the read data, so that it is possible to read out accurate data according to the timing of read access.

Further, while the address decoder is needed in the method of preventing activation of the pad that is floated using a dedicated control register, the activation control of the buffer is performed using the read access signal for each activation control unit according to the present invention, whereby there is no need to provide the address decoder and thus size of additional circuits can be reduced. Hence, the present invention can be realized without increasing the size of the circuit.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor chip comprising:
a plurality of pads;
input circuits or output circuits that are electrically connected to the pads;
a main control unit that outputs a read access signal, the read access signal controlling reading of signals from an external circuit or an internal circuit; and
activation control units that control activation of the input circuits or the output circuits that are electrically connected to the pads based on the read access signal, the pads receiving the signals from the external circuit or the internal circuit.

2. The semiconductor chip according to claim 1, wherein the activation control units set the input circuits or the output circuits that are electrically connected to the pads to an active state in advance based on a first read access signal, the pads receiving the signals from the external circuit or the internal circuit, and
the input circuits or the output circuits that are made active transfer signals applied to the pads from the external circuit to the internal circuit or transfer the signals applied to the pads from the internal circuit to the external circuit based on a second read access signal.

3. The semiconductor chip according to claim 1, wherein each of the activation control units comprises:
a logical OR circuit; and
a flip-flop that outputs an activation signal that activates the input circuit or the output circuit,
the logical OR circuit outputs logical OR between the activation signal output from the flip-flop and the read access signal output from the main control unit, and
the flip-flop latches an output signal from the logical OR circuit and outputs the activation signal.

4. The semiconductor chip according to claim 1, further comprising a product information storage unit that stores product information, wherein
each of the activation control units controls activation of the input circuit or the output circuit that is electrically connected to a pad based on a control signal based on the product information and the read access signal, the pad receiving the signal from the external circuit or the internal circuit.

5. The semiconductor chip according to claim 1, further comprising an operation mode judgment unit that judges operation modes of the input circuits or the output circuits, wherein
each of the activation control units controls activation of the input circuit or the output circuit that is electrically connected to a pad based on the read access signal and an operation mode judgment signal generated as a result of judgment of the operation mode, the pad receiving the signal from the external circuit or the internal circuit.

6. A semiconductor device comprising:
a semiconductor chip comprising:
a plurality of pads;
input circuits or output circuits that are electrically connected to the pads;
a main control unit that outputs a read access signal, the read access signal controlling reading of signals from an external circuit or an internal circuit; and
activation control units that control activation of the input circuits or the output circuits that are electrically connected to the pads based on the read access signal, the pads receiving the signals from the external circuit or the internal circuit; and
leads on which the semiconductor chip is mounted, the leads electrically connected to the pads.

7. A semiconductor chip comprising:
a plurality of pads;
input circuits or output circuits that are electrically connected to the pads;
a main control unit that outputs a read access signal, the read access signal controlling reading of signals from an external circuit or an internal circuit; and
activation control units that control activation of the input circuits or the output circuits that are electrically connected to the pads based on the read access signal, the pads receiving the signals from the external circuit or the internal circuit, wherein each of the activation control units comprises:
a logical OR circuit that outputs logical OR between the read access signal output from the main control unit and an activation signal output from the flip-flop; and
a flip-flop that latches an output signal from the logical OR circuit, and outputs the activation signal that activates the input circuit or the output circuit,
the activation control units set the input circuits or the output circuits that are electrically connected to the pads to an active state in advance based on a first read access signal, the pads receiving the signals from the external circuit or the internal circuit, and
the input circuits or the output circuits which are made active transfer signals applied to the pads from the external circuit to the internal circuit or transfer signals applied to the pads from the internal circuit to the external circuit based on a second read access signal that is output subsequent to the output of the first read access signal.

* * * * *